(12) United States Patent
Keller

(10) Patent No.: US 6,262,538 B1
(45) Date of Patent: Jul. 17, 2001

(54) HIGH DENSITY PLASMA TOOL WITH ADJUSTABLE UNIFORMITY AND STOCHASTIC ELECTRON HEATING FOR REDUCED GAS CRACKING

(75) Inventor: John H. Keller, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/383,773

(22) Filed: Aug. 26, 1999

(51) Int. Cl.[7] ............................................. H01J 7/24
(52) U.S. Cl. .................... 315/111.21; 315/111.41; 118/723 AN; 156/345
(58) Field of Search .................. 343/701, 895, 343/700 MS, 850, 853; 315/111.21, 111.41, 111.51, 111.71; 427/569, 571; 118/723 I, 723 IR, 723 AN; 156/345

(56) References Cited

U.S. PATENT DOCUMENTS

| | | | |
|---|---|---|---|
| 3,828,351 | * 8/1974 | Voronoff | 343/740 |
| 5,944,902 | * 8/1999 | Redeker | 118/723 AN |
| 6,030,667 | * 2/2000 | Nakagawa et al. | 427/569 |
| 6,043,608 | * 3/2000 | Samukawa et al. | 315/111.51 |
| 6,072,147 | * 6/2000 | Koshiishi et al. | 219/131.43 |

* cited by examiner

Primary Examiner—Haissa Philogene
Assistant Examiner—Ephrem Alemu
(74) Attorney, Agent, or Firm—McGuireWoods, LLP; Jay H. Anderson

(57) ABSTRACT

VHF/UHF power having a frequency of about 40 MHz or higher is applied across generally radial elements of an antenna and the phase of a standing wave component of the voltage in the generally radial elements is adjusted to provide relatively uniform density of a high density plasma across an area of at least the size of a semiconductor wafer being processed. Capacitive coupling of power to the plasma enhances the hot tail distribution of electron energies which is associated with low levels of gas cracking and the production of radicals such as fluorine which are not material-selective in semiconductor processing operations such as oxide etching. Accordingly, material-selectivity of processes may be maintained while the high density plasma accelerates the process to significantly improve tool throughput.

20 Claims, 3 Drawing Sheets

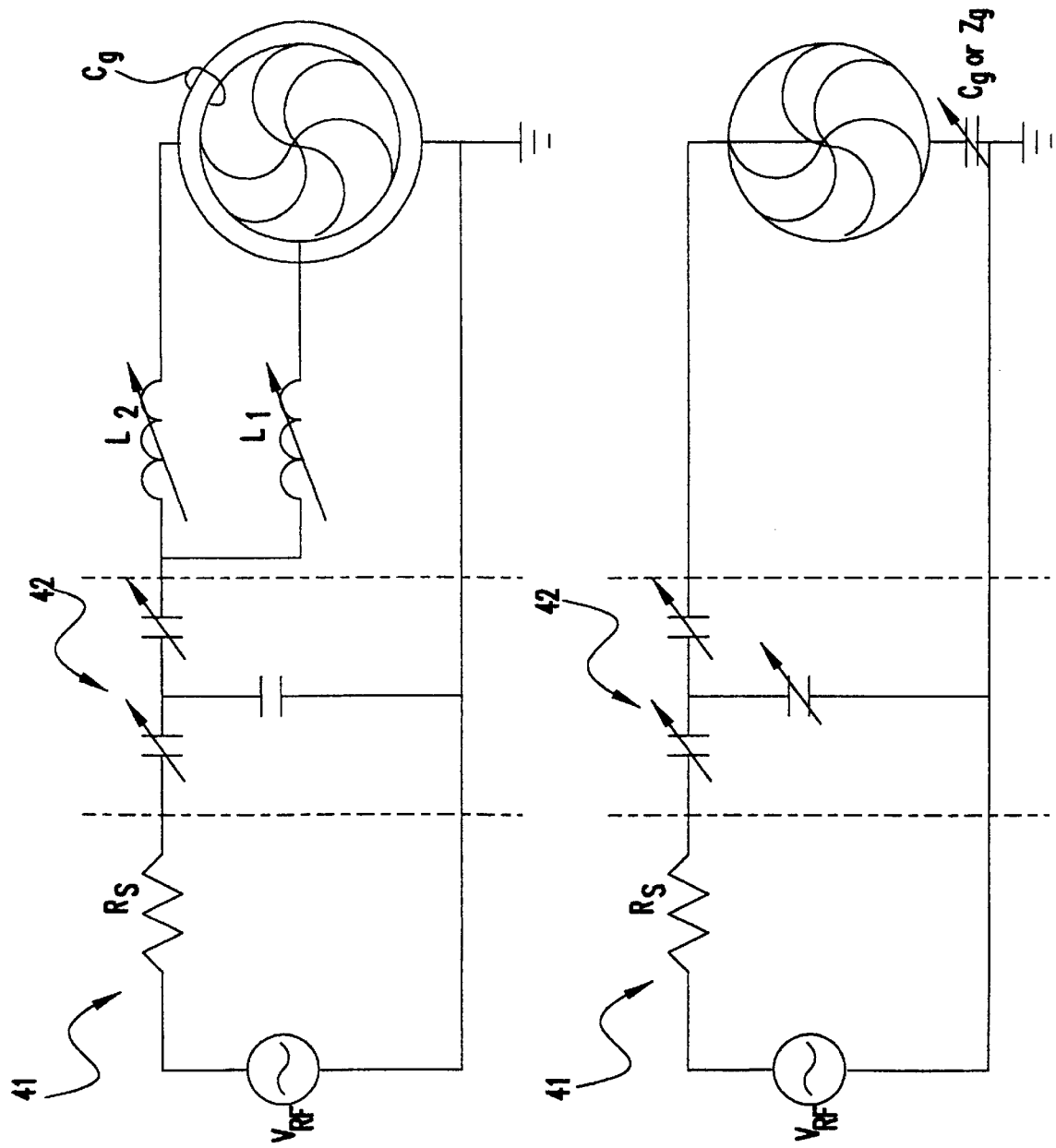

HIGH DENSITY PLASMA TOOL WITH ADJUSTABLE UNIFORMITY AND STOCHASTIC ELECTRON HEATING FOR REDUCED GAS CRACKING

BACKGROUND OF THE INVENTION

1. Field of the Invention

The present invention generally relates to processing of materials with a plasma and, more particularly, to selective plasma etching processes, especially as used in semiconductor device manufacture.

2. Description of the Prior Art

The art of semiconductor electronic device manufacture has become highly sophisticated in recent years to provide a wide range of electrical properties of the devices, often at very high integration density. Generally, device location and basic dimensions of electronic devices included in integrated circuits are defined by a lithographic process and, at the high integration densities currently possible and foreseeable, many subsequent processes are performed in a manner which is self-aligned or material-selective in order to develop structures at sizes smaller than the resolution of lithographic processes and/or avoid problems associated with possible overlay positional errors and mis-registration of plural lithographic patterning processes.

Further, at the current state of the art, many properties of electronic devices are controlled or established by the dimensions of various structures in the devices. For example, gate insulator thicknesses in field effect transistors have become relatively critical to switching speed, capacitive loading of circuits providing an input thereto, off-current leakage and the breakdown voltage which the gate must withstand without damage to the gate insulator. In general, when thickness dimensions are critical, it is preferred to achieve the desired dimension by an etching process for maximal accuracy. Such etching processes must generally be performed with etchants which are highly selective to the material (e.g. oxide) to be etched since protection of other surfaces with lithographically patterned resists may not be economically feasible or even possible.

High accuracy of such processes implies that the process must be highly controllable and repeatable with good uniformity. In the past and, to some extent at the present time, relatively slow processes have been tolerated to achieve the required accuracy and uniformity, particularly for research, application specific integrated circuits (ASICS) and other low-volume devices. However, the capability to determine the electrical properties of such structures with high reliability, consistency and manufacturing yield as well as acceptable economy is often limited, as a practical matter, by the tools used for processing the semiconductor material, usually in the form of a wafer. Such tools are often complex and of high precision. Therefore such tools are generally expensive to build and maintain. The principal expense of modern production integrated circuits is thus a portion of the cost of the tools used to produce them and, therefore, varies inversely with tool throughput. Accordingly, the use of faster processes is required for acceptable economy and unit cost.

To achieve faster processes for semiconductor manufacture, many processes have been developed which employ a plasma formed by inducing ionization of one or more selected materials in carefully regulated concentrations or pressures. For example, the etching process which is highly selective to oxide is generally performed using a gas such as $Si(CF_3)_x$ which, when ionized to form a plasma, provides silicon ions and $CF_3$ radicals. The $CF_3$ radicals are highly selective to the etching of silicon oxide, particularly in the presence of silicon ions.

However, by the same token, the speed of the etching process is highly dependent on the concentration of $CF_3$ radicals and hence on the degree of ionization of the etchant gas. The degree of ionization of the etchant gas is, in turn, dependent on the amount of energy or strength of the electric field applied thereto.

It can be appreciated that a plurality of chips are formed concurrently on one or more wafers placed in a reactor vessel and the wafers can be of substantial dimensions. Therefore, for practical manufacturing processes, a highly uniform plasma must be developed over a wide area in order to avoid substantial variations in device performance and specifications across a wafer or even across a chip; either of which would be unacceptable in a production volume manufacturing application.

Unfortunately, known arrangements for producing a plasma do not provide adequately uniform application of energy or electrical fields to the process gas particularly at high plasma densities. In fact, known arrangements include antennas that invariably cause a substantial peak in voltage at about the center of a radius thereof. The voltage pattern can also be significantly affected by the geometry and materials of the reactor vessel as well as external fields.

The problem of process uniformity and high process speed is further complicated and high voltage levels required for high plasma densities by another incident of plasma chemistry referred to as gas cracking. In the above example in which $Si(CF_3)_x$ is used as an etchant, the $CF_3$ radicals of the dominant etchant gas can be further broken down or "cracked" to yield free fluorine radicals. Fluorine radicals are not selective to oxide and, in fact, are observed to etch silicon and other silicon compounds somewhat preferentially to silicon oxide. (However, it should be appreciated that some small degree of gas cracking is considered to be beneficial to many etching processes and the rate at which they proceed to the degree the effects thereof can be predicted and compensated at low power and ionization levels.)

Therefore, the production of an excess of highly reactive fluorine ions by gas cracking effectively destroys the selectivity required for the process. Further, since gas cracking is not easily controllable and concentrations of fluorine ions cannot be easily monitored, the repeatability of etching of oxide to a desired thickness is also lost. In essence, the result is that the problem of gas cracking precludes the maximum plasma densities and maximum process speeds from being achieved or even closely approached for many plasma enhanced processes including the example of oxide etching discussed above. That is, if the amount of ionization is maintained below that at which excess gas cracking will occur, the average plasma density will be far below that which would provide a maximal or even economically acceptable process rate. Further, the rate at which the process proceeds will vary substantially across the wafer, possibly yielding inconsistent electrical properties of devices on a single chip, and device damage.

To develop the highest possible etch rates for other materials, so-called inductively coupled plasma (ICP) processes and tools capable of inductively heating electrons and developing high density plasmas (HDP) have been developed and are in widespread use for etching of both metal and polysilicon. However, such tools are not suitable for HDP etching of oxides. While HDP ICP tools are necessary for higher plasma densities and higher etch rates, HDP ICPs crack the fluorocarbon radicals in the dominant etchant gas as described above.

Rather, capacitively coupled parallel plate magnetrons and multi-frequency sources are often used for many advanced oxide etches even though they are incapable of approaching the plasma densities of HDP tools or producing reasonably or acceptably uniform plasma density distributions at more than moderate plasma densities. Such capacitively coupled tools provide stochastic heating of electrons. These stochastically heated electrons have a hot tail distribution of the electron energy distribution function (EEDF) which is greater than that of a Boltzmann distribution. The hot tail distribution is associated with reduced gas cracking levels, while producing the same ion density.

Several reports of research on ultra high frequency (UHF) high density plasma systems have been published over the last few years. It has been claimed in these reports that 500 MHz and 150 MHz systems were inductively coupled plasmas that provided, relative to HDP ICP systems of equal plasma densities, lower gas cracking, lower electron temperatures for the main body of the electrons, hot tail electrons in the EEDF and no transverse magnetic fields or ExB effects adjacent the wafer or target.

However, while all of these asserted qualities are desirable for an oxide etch system as well as other HDP systems, there has been no solution to lack of uniformity of plasma density distribution over an area of practical dimensions for semiconductor processing in production environments, particularly for an oxide etch process. Uniformity of plasma density and potential are particularly important not only as a matter of uniformity of oxide etching and the progress of other processes but to avoid damage to the devices being produced during the etching process since damaging currents are due to absolute plasma density changes rather than percentage changes. It can readily be appreciated that such damage, particularly in regard to gate oxides, can dramatically reduce manufacturing yields.

SUMMARY OF THE INVENTION

It is therefore an object of the present invention to provide an adjustable and substantially uniform plasma distribution over a wide area and at high plasma densities.

It is another object of the invention to provide a plasma tool for selective and substantially uniform etching of oxides at high rates and substantially devoid of excess gas cracking effects.

It is a further object of the invention to provide a method and apparatus for providing control of voltage profile in the radial direction of a radially symmetrical antenna in accordance with the invention.

In order to accomplish these and other objects of the invention, a method of controlling plasma density is provided including the steps of applying a VHF/UHF signal having a frequency equal to or greater than 40 MHz across generally radial antenna elements to produce a voltage having a standing wave component therein, and adjusting a voltage profile of the standing wave component along the generally radial antenna elements.

In accordance with another aspect of the invention, an antenna is provided for coupling electrical power to a plasma including a first plate having a plurality of generally radial elements, a second plate electrically connected to outer ends of the generally radial elements, and a third plate forming a distributed capacitance with the second plate and electrically connected to inner ends of the generally radial elements.

In accordance with a further aspect of the invention, a plasma tool is provided including an antenna having a plurality of generally radial elements, an arrangement for applying VHF/UHF power of a frequency of about 40 MHZ or higher across the generally radial elements to establish a voltage thereon having a standing wave component, and and arrangement for adjusting phase of the standing wave component to control a voltage profile along the generally radial elements.

BRIEF DESCRIPTION OF THE DRAWINGS

The foregoing and other objects, aspects and advantages will be better understood from the following detailed description of a preferred embodiment of the invention with reference to the drawings, in which:

FIGS. 4 and 5 are circuits providing control of voltage along the radial direction of the antenna of FIGS. 1–3.

DETAILED DESCRIPTION OF A PREFERRED EMBODIMENT OF THE INVENTION

Figure 1:
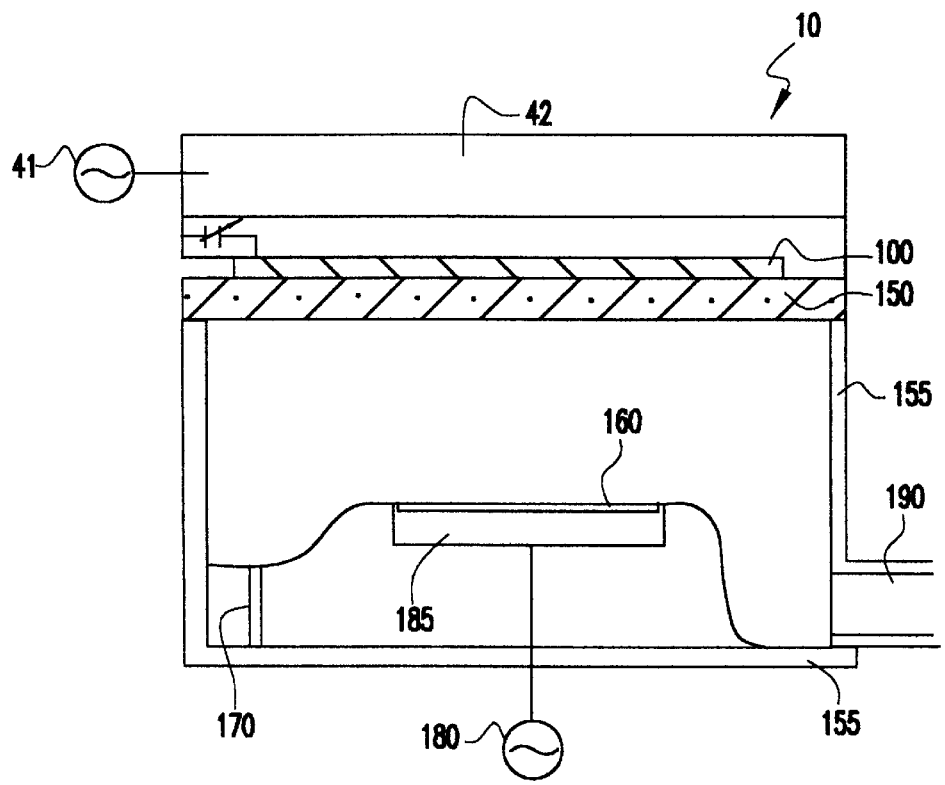
FIG. 1 is a side, cross-sectional view of a reaction chamber in accordance with a preferred embodiment of the invention.

Referring now to the drawings, and more particularly to FIG. 1, there is shown a side, cross-sectional view of a schematic representation of a reaction chamber or vessel 10 in accordance with a preferred form of the invention. It should be understood that the depiction of FIG. 1, being largely schematic, will share many characteristics with known reaction vessels developed for performing various semiconductor wafer processing operations. By the same token, it is to be understood that details thereof are not critical to the practice of the invention. Further, at the level of detail shown in FIG. 1 numerous salient details, particularly involving the antenna arrangement, and elements related thereto of the invention are omitted and, to that extent, the depiction of FIG. 1 can be considered as representing either known systems or the invention in its preferred environment. Accordingly, no portion of FIG. 1 is admitted to be prior art in regard to the present invention.

Reactor vessel 10 comprises a sealed vacuum chamber comprising walls and bottom 155 and a dielectric window 150 which allows coupling of electrical fields therethrough while walls and bottom 155 preferably provide shielding from other fields in the vicinity of chamber 10. Antenna 100 is preferably mounted adjacent dielectric window 150. Advantageously, an impedance matching network 42, receiving a VHF/UHF signal from source 41, is mounted directly above the antenna 100 to minimize stray capacitive and inductive coupling which may or may not be of a magnitude that would affect or limit performance of the invention.

Wafer 160 is preferably held on a wafer electrode 185 which receives a radio frequency (RF) signal from source 180 in accordance with the intended plasma process. Reactant gas is provided through an inlet, schematically depicted at 170. The desired vacuum level is maintained through duct 190 which also serves to draw off reaction products in a manner well-understood in the art. Locations of inlet 170 and duct 190 are schematically depicted at opposite sides of the reaction chamber or vessel 10 to indicate that their actual positions should be arranged to provide substantially uniform supply and removal of materials to and from the surface of the wafer.

Figure 1A:
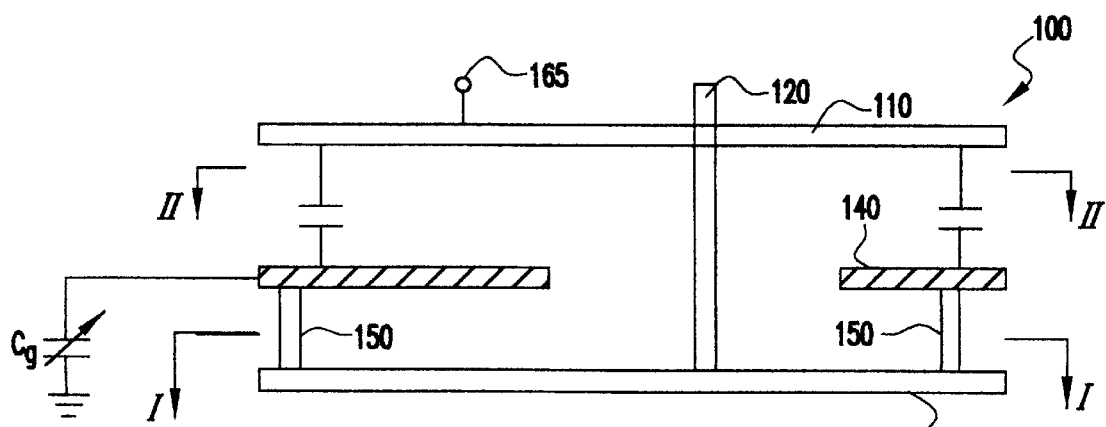
FIG. 1A is a side view of a preferred form of a radially symmetrical antenna structure depicted in FIG. 1 in accordance with the invention.
Figure 2:
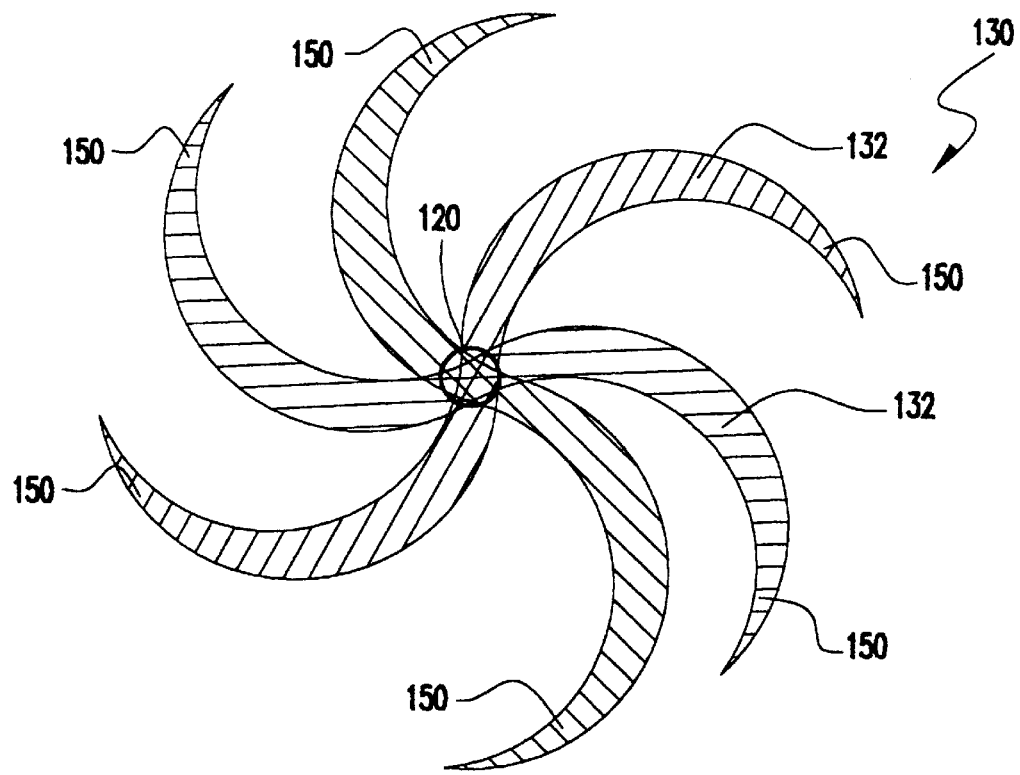
FIGS. 2 and 3 are plan views of portions of the radially symmetrical antenna of FIG. 1 as seen at sections 2—2 and 3—3, respectively, indicated therein.
Figure 3:
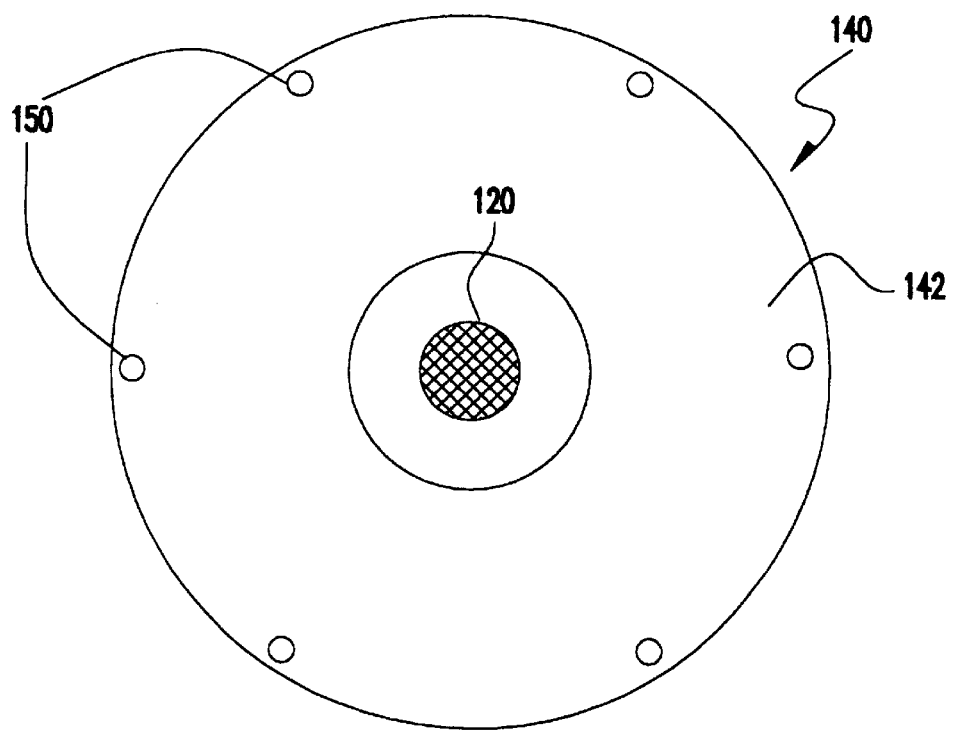

Referring now to FIG. 1A which may be regarded as a detail of FIG. 1, there is shown a side view of a preferred form of an antenna 100 in accordance with the invention. Parts of the antenna are also shown in FIGS. 2 and 3. While this antenna comprises capacitively coupled elements, as do some known antennas for plasma tools, it is to be understood that no portion of any of FIGS. 1A–3 or representations thereof in other Figures are admitted to be prior art in regard to the present invention.

The preferred antenna 100 in accordance with the invention comprises three plates 110, 130 and 140 of differing configurations. It should be understood that any or all of these plates, particularly 130 could be formed in different layers or other combinations of parts. Nevertheless, the term "plate" will be used hereinafter for convenience and economy of expression particularly as the term functionally connotes capacitive coupling thereof.

Two of these plates 110, 130 are electrically and mechanically connected by a central hub connection 120. Base plate 110 is used for mechanical mounting of the antenna within the tool in a manner which is not critical to the practice of the invention other than to insulate it and generally minimize capacitive coupling to other structures. Base plate 110 is preferably in the form of a circular disk, preferably of a high conductivity metal such as aluminum, copper or brass, with or without a plating of gold, silver or copper, which is ohmically connected to a conductive central hub connection 120, preferably in the form of a post or stand-off. The other end of the central hub connection is ohmically connected to a multi-spiral layer 130, also preferably circular and of approximately the same radius or diameter as base plate 110.

The multi-spiral layer 130 may advantageously be formed of a plurality (e.g. three) of metal lamina, each forming an S-shaped or spiral portion 132 extending generally across each lamina from diametrically opposed points and intersecting a central connection point, preferably in the form of an aperture to form generally radial antenna elements. Fabricating plate 130 from a plurality of lamina provides the advantage of being able to easily establish identical shapes for the S-shaped portions but such a construction is not otherwise important to the practice of the invention. Equiangular displacements between lamina are readily achieved by simple measurements or a jig.

The outer ends of the S-shaped portions are not connected together but each is supported mechanically and electrically connected to an annular central plate 140, shown in plan view in FIG. 3, by post or stand-off connections 150. This geometry provides a lower inductance or inductive impedance at the frequencies of interest in the return path than a common circular connection in the plane of plate 130.

A VHF/UHF voltage signal (the division between VHF and UHF is not consistently defined in the art and VHF/UHF will be used hereinafter to indicate a frequency of about 40 MHz or higher) is provided to the base plate 110 or central hub connection 120 and thus to the center of plate 130, as schematically shown at input 165. The signal return path is provided from the outer ends of the S-shaped members 132 through central plate 140. A distributed capacitance will exist between central plate 140 and base plate 110 and this capacitance is preferably distributed over an area which is coextensive with a major portion of the S-shaped regions 132 of plate 130.

Also shown in FIG. 1A is a small variable capacitcance (Cg) coupling to ground which may be formed in several ways including inherent parasitic coupling. Exemplary forms of this variable capacitance (which may or may not, in fact, be variable) will be discussed below.

In this regard, a desirable design criterion for the preferred antenna structure (which may take many forms that will be evident to those skilled in the art, in view of the following discussion) is to develop a capacitance to the return element which is sufficiently large that the change in impedance due to the presence of a plasma or fluctuations in plasma density is a relatively small fraction of the load impedance. This large capacitance makes the system easier to "light" (e.g. initiate ionization to form the plasma) and the power coupled to the plasma less affected by electron density changes.

It should also be understood from the foregoing that the actual shapes of the spiral S-shaped regions 132, while preferred, are not critical to the practice of the invention and the invention may be practiced with straight "spokes" extending in a radial direction or at an angle thereto or with more or less curve than shown in FIG. 2. The general nature of the S-shape, however, provides additional length significantly greater than a radius of the antenna along which the location of the maximum voltage and plasma density may be adjusted. This allows greater voltage variation, somewhat greater precision of radial adjustment of maximum voltage and reduced sensitivity to non-linearities of variable inductors and capacitors utilized in the drive circuit therefor. It may be possible to form the S-shaped regions in a manner to compensate for other regions of sensitivity and non-linearity of the adjustment procedure or better coverage of the wafer area but such a facility is certainly not essential to the successful realization of the meritorious effects of the invention.

In this regard, the electrical half-length (from the center to the distal ends) of the spiral S-shaped elements should preferably be approximately one-quarter wavelength of the frequency at which the antenna is to operate, which is considered to be more easily accommodated by a curved element. The spiral S-shaped elements also cover a greater area within the periphery of the antenna and are believed to contribute to increased uniformity of the plasma.

The basic function of the invention is to provide for adjustment of location of the maximum voltage field radially along portions of the antenna as described above and to adjust the amount of radial voltage variation. The control of position of the maximum voltage and voltage variation, in turn, controls the radial density profile of the plasma (which may vary radially due to other causes such as diffusion to the reaction chamber structures to deplete the plasma at its periphery). Thus, when any deficiency of plasma density in the radial direction can be empirically determined, the radial position of the maximum voltage (or the ratio of voltages at the center and periphery of the antenna) can be adjusted to compensate therefor and thus produces a very uniform plasma density over a wide area regardless of the process for which it may be so adjusted.

It should also be recognized that the inventor has appreciated that stochastic heating of electrons in sheaths near the UHF antenna is known to be proportional to the square of the frequency at which the antenna is driven and is much greater than inductive heating reported as alluded to above for that reason. Further, the inventor has discovered that the results reported are possibly more consistent with stochastic heating than with inductive heating to which the "hot tail" is attributed in the noted reports.

In any event, the published reports do not suggest development of a uniform plasma density or any other optimization of plasma distribution. Further, if the result is attributed to inductive heating as indicated in the reports, it would lead to control of the location of maximum current in an antenna that is very different from that discussed above and, since voltage is minimized where current is maximized and vice-versa, would lead directly away from an arrangement that optimizes stochastic heating to produce the "hot tail" and uniform plasma distribution.

This radial control of voltage and plasma density can be achieved in accordance with the invention in different ways; of which two are sufficiently exemplary to allow practice of a wide range of variation of the invention. These two exemplary methods and circuit arrangements will now be discussed in connection with FIGS. 4 and 5. It should be understood that the circuits shown in FIGS. 4 and 5 are exemplary and idealized for simplicity and clarity, as well. Details of specific circuits that may be used are not important to the practice of the invention and various techniques similar to those of the circuits of FIGS. 4 and 5 will be evident to those skilled in the art in light of the following discussion.

A first of these exemplary techniques utilizes a so-called nearly traveling wave. A nearly travelling wave is one in which a the wave travelling through the antenna and a reflection thereof, adjusted in amplitude and phase are superimposed to form a wave which is essentially a superposition of a relatively small standing wave and a travelling wave component. The phase and magnitude of the standing wave can be adjusted by variable inductors L1 and L2 or by numerous types of circuits which will be evident to those skilled in the art. However, a suitable circuit is shown in FIG. 4 which is similar to a circuit published by Wu and Liebermann (Applied Physics Letters, Vol. 72, Nov. 7, 1998, p. 777) and intended to produce a constant current in a fully inductive circuit including a large serpentine antenna.

The circuit of FIG. 4 includes a VHF/UHF signal generator section 41 which includes a source Vrf, capable of providing a VHF/UHF signal in excess of 40 MHz and having an output impedance Rs, and an impedance matching network 42. An exemplary "T" network of fixed and variable capacitors is shown but other types of impedance matching networks for maximizing or otherwise adjusting power transfer (e.g. "L" and "π" networks and others) are known and can be used as may be convenient. However, a "T" network shown is somewhat preferred as having greater orthogonality between amplitude and phase provided by its variable elements. A variable inductance is placed in series with connections to each of the center and outer ends of the antenna described above in the discussion of FIGS. 1A–3. Capacitive coupling to ground, Cg, is provided through plasma coupling and stray or parasitic capacitance such as to the reaction chamber. This capacitive coupling is depicted as a grounded electrode around the antenna in FIG. 4. Such an expedient/structure can, of course, be physically provided.

Since the antenna is principally a capacitive load, the variable inductors are adjusted to be nearly in resonance therewith at the drive frequency and thus inject waveforms of the same shape but slightly differing in amplitude and/or phase into opposite ends of all radial parts (e.g. respective halves of the S-shaped portions of the multi-spiral plate 130) of the antenna. The input signals thus superimposed in all of the radial antenna elements 132 produce an adjustable voltage profile in the radial direction by which the plasma density can be made substantially uniform.

Referring now to FIG. 5, a second exemplary circuit for producing a standing wave (with a small travelling wave component, due to power transferred to the plasma) which is adjustable in phase will now be discussed. As in the circuit of FIG. 4, a signal generator 41 and impedance matching network 42 are provided and need not be further discussed. (It may be desirable to provide that additional elements of the matching network are variable in value to increase orthogonality of adjustments.) In this case, the output of the impedance matching network is connected directly to the center of the antenna 100 while the return path is from the outer ends of radial portions 132 through plate 140 of the antenna 100 or vice-versa.

The return path is capacitively coupled to ground through Cg. In this case, it is considered preferable to provide a variable capacitor element or impedance network for the purpose. By varying the impedance Zg to ground, with capacitor Cg (or, more generally an inductance or LC network, or the like), the phase of the standing wave on the radial portions 132 of the antenna can be adjusted to develop a substantially uniform plasma density.

In view of the foregoing, it is seen that the invention provides a technique including a methodology and apparatus for performing it that is capable of providing a substantially uniform plasma over a wide area comparable to the size of the antenna and which can be scaled to any desired size. By providing a substantially uniform plasma density over the area of one or more wafers, plasma processes such as etching can be performed with high uniformity and repeatability. Since the plasma density is substantially uniform, higher plasma densities and correspondingly higher process rates can be achieved while avoiding deleterious effects such as excessive gas cracking; some modicum of gas cracking being substantially unavoidable and beneficial to etching processes. Further, stochastic heating of electrons in the sheath near the antenna achieves lower levels of gas cracking and lower temperature for the main body of the electrons than have previously been achieved at comparable plasma densities by providing control of the voltage profile in the radial direction of the antenna 100 which has not been previously available in the art.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of controlling plasma density including the steps of
    applying a VHF/UHF signal having a frequency equal to or greater than 40 MHz across generally radial antenna elements to produce a voltage having a standing wave component therein, and
    adjusting a voltage profile of said standing wave component along said generally radial antenna elements to produce a substantially uniform plasma density by capacitive coupling power to said plasma in accordance with said voltage profile.

2. A method as recited in claim 1, wherein said voltage is a nearly travelling wave.

3. A method as recited in claim 1, wherein said voltage is a standing wave.

4. An antenna for coupling electrical power to a plasma including
    a first plate having a plurality of generally radial elements,
    a second plate electrically connected to outer ends of said generally radial elements, a third plate forming a distributed capacitance with said second plate and electrically connected to inner ends of said generally radial elements, and a capacitive impedance from said second plate to ground.

5. An antenna as recited in claim 4, wherein said second plate is annular and disposed between said first plate and said third plate.

6. An antenna as recited in claim 4, wherein said generally radial elements are curved.

7. An antenna as recited in claim 6, wherein radially opposed ones of said plurality of said generally radial elements as formed as S-shaped lamina.

8. An antenna as recited in claim 4, further including a variable capacitance to ground.

9. An antenna as recited in claim 8, wherein said variable capacitance is connected to said second plate.

10. A plasma tool including an antenna having a plurality of generally radial elements, means for applying VHF/UHF power of a frequency of about 40 MHZ or higher across said generally radial elements to establish a voltage thereon having a standing wave component, and means for adjusting phase of said standing wave component to control a voltage profile along said generally radial elements to produce a substantially uniform plasma density by capacitive coupling power to said plasma in accordance with said voltage profile.

11. A plasma tool as recited in claim 10, wherein said means for applying VHF/UHF power produces a nearly travelling wave in said generally radial elements.

12. A plasma tool as recited in claim 10, wherein said means for applying VHF/UHF power produces a standing wave in said generally radial elements.

13. A plasma tool as recited in claim 10, wherein said antenna includes a first plate having a plurality of generally radial elements, a second plate electrically connected to outer ends of said generally radial elements, and a third plate forming a distributed capacitance with said second plate and electrically connected to inner ends of said generally radial elements, and a capacitive impedance from said second plate to ground.

14. A plasma tools as recited in claim 13, wherein said second plate is annular and disposed between said first plate and said third plate.

15. A plasma tool as recited in claim 13, wherein said generally radial elements are curved.

16. A plasma tool as recited in claim 15, wherein radially opposed ones of said plurality of said generally radial elements are formed as S-shaped lamina.

17. A plasma tool as recited in claim 13, wherein said antenna further includes a variable capacitance to ground.

18. A plasma tool as recited in claim 17, wherein said variable capacitance is connected to said second plate.

19. A method as recited in claim 1 wherein said voltage profile is generally larger at a distal end of said radial antenna elements than near an inner end of said radial antenna elements.

20. A plasma tool as recited in claim 10 wherein said voltage profile is generally larger at a distal end of said radial antenna elements than near an inner end of said radial antenna elements.

* * * * *